(12) United States Patent
Park

(10) Patent No.: US 7,190,231 B2
(45) Date of Patent: Mar. 13, 2007

(54) HIGH-PERFORMANCE CHARGE-PUMP CIRCUIT FOR PHASE-LOCKED LOOPS

(75) Inventor: Sangbeom Park, Tracy, CA (US)

(73) Assignee: ANA Semiconductor, Tracy, CA (US)

( * ) Notice: Subject to any disclaimer, the term of this patent is extended or adjusted under 35 U.S.C. 154(b) by 72 days.

(21) Appl. No.: 11/104,112

(22) Filed: Apr. 11, 2005

(65) Prior Publication Data

US 2006/0226917 A1  Oct. 12, 2006

(51) Int. Cl.
  *H03L 7/00* (2006.01)
(52) U.S. Cl. .................... 331/17; 327/157; 327/536
(58) Field of Classification Search ............... 331/117, 331/17; 327/536, 157
See application file for complete search history.

(56) References Cited

U.S. PATENT DOCUMENTS

| | | | | | |
|---|---|---|---|---|---|
| 4,745,372 A | * | 5/1988 | Miwa | ............... | 331/8 |
| 5,357,216 A | * | 10/1994 | Nguyen | ............... | 331/25 |
| 5,473,283 A | * | 12/1995 | Luich | ............... | 331/8 |
| 5,625,306 A | * | 4/1997 | Tada | ............... | 327/112 |
| 5,818,303 A | * | 10/1998 | Oishi et al. | ............... | 331/1 A |
| 6,329,872 B1 | * | 12/2001 | Foroudi | ............... | 327/541 |
| 6,586,976 B2 | * | 7/2003 | Yang | ............... | 327/157 |
| 7,071,744 B2 | * | 7/2006 | Kang et al. | ............... | 327/157 |

* cited by examiner

*Primary Examiner*—Benny Lee
*Assistant Examiner*—Levi Gannon

(57) ABSTRACT

One of the high-performance charge-pump circuits basically includes two switch mirror circuits, two current sources, two switches, and an inverter. In the switch mirror, the switch coupled to the diode-connected reference transistor is indirectly mirrored to the output. The great advantage is to utilize the switch mirrors as a part of building cascodes at the output. Consequently, all high-performance charge-pump circuits suppress any charge-injection errors, reduce charge-pump offset, increase the output impedance for effective current injection, and reduce chare-sharing problem.

20 Claims, 4 Drawing Sheets

HIGH-PERFORMANCE CHARGE-PUMP CIRCUIT FOR PHASE-LOCKED LOOPS

FIELD OF THE INVENTION

The present invention relates to the field of charge-pump circuit and more particularly to high-performance charge-pump circuit for phase-locked loops.

BACKGROUND ART

Phase-looked loop is a vitally important device. Phase-looked loop is analog and mixed signal building block used extensively in communication, networks, digital systems, consumer electronics, computers, and any other fields that require frequency synthesizing, clock recovery, and synchronization.

Prior Art FIG. 1 illustrates a block diagram of a conventional phase-locked loop. The conventional phase-locked loop 100 typically consists of a phase-frequency detector (or phase detector), a charge-pump 120, a low-pass filter, and a voltage-controlled oscillator in a loop. Phase-locked loops without any frequency divider in a loop are considered here for simplicity. The phase-frequency detector (or phase detector) is a block that has an output voltage with an average value proportional to the phase difference between the input signal and the output signal of the voltage-controlled oscillator. The charge-pump either injects the charge into the low-pass filter or subtracts the charge from the low-pass filter, depending on the outputs of the phase-frequency detector (or phase detector). Therefore, change in the low-pass filter's output voltage drives the voltage-controlled oscillator. The negative feedback of the loop results in the output of the voltage-controlled oscillator being synchronized with the input signal. As a result, the phase-locked loop is in lock.

The conventional charge-pump circuit 120 of Prior Art FIG. 1 is illustrated. Assuming the upper charge-pump current source and the lower charge-pump current source are equal in magnitude, the average current flowing into the output node $V_C$ or flow out of the output node $V_C$ is expressed as $$I_{AVG} = \frac{\Delta \Phi_{IN}}{2\pi} I_{CH}$$

where $\Delta\Phi_{IN}$ is the phase difference. When MOS switches turn off, charge-injection errors occur. The channel charge of a switch that has zero drain-source voltage (i.e., $V_{DS}$) is given by $Q_{CH}=WLC_{OX}(V_{GS}-V_T)$. As a result, temporary glitches occur. The conventional charge-pump circuit 120 provides direct charge-injection error into the output node $V_C$ because the drains of the MOS switches are coupled to the output node $V_C$. Even though the current source and MOS switch are exchanged in the conventional charge-pump circuit 120, indirect charge-injection errors into the output node $V_C$ can not be greatly alleviated. For these reasons, the conventional charge-pump circuit 120 of Prior Art FIG. 1 is very inefficient to implement in an integrated circuit (IC) or system-on-chip (SOC).

Thus, what is desperately needed is a high-performance charge-pump circuit that can be highly efficiently implemented with a drastic improvement in suppressing any charge-injection errors, reducing charge-pump offset (i.e., reducing the power of the spurious sidebands in the synthesized output signal), increasing the output impedance for effective current injection, reducing chare-sharing problem, and saving chip area. The present invention satisfies these needs by providing high-performance charge-pump circuits.

SUMMARY OF THE INVENTION

The present invention provides three types of the high-performance charge-pump circuits for phase-locked loops. The basic architecture of a high-performance charge-pump circuit consists of two switch mirror circuits, two current sources, two switches, and an inverter. Since switch mirrors are employed, transistor charge injection and clock feed through to the output is greatly reduced.

Consequently, all high-performance charge-pump circuits provide a significant reduction in charge-pump offset, a great reduction in the power of the spurious sidebands in the synthesized output signal, an increase in the output impedance for effective current injection, and a reduction in chare-sharing problem.

BRIEF DESCRIPTION OF THE DRAWINGS

The accompanying drawings, which are incorporated in and form a part of this specification, illustrate three embodiments of the invention and, together with the description, serve to explain the principles of the invention.

Prior Art

DESCRIPTION OF THE PREFERRED EMBODIMENTS

In the following detailed description of the present invention, three types of the high-performance charge-pump circuits, numerous specific details are set forth in order to provide a thorough understanding of the present invention. However, it will be obvious to one skilled in the art that the present invention may be practiced without these specific details. In other instances, well known methods, procedures, CMOS digital gates, components, and metal-oxide-semiconductor field-effect transistor (MOSFET) device physics have not been described in detail so as not to unnecessarily obscure aspects of the present invention.

Figure 1:
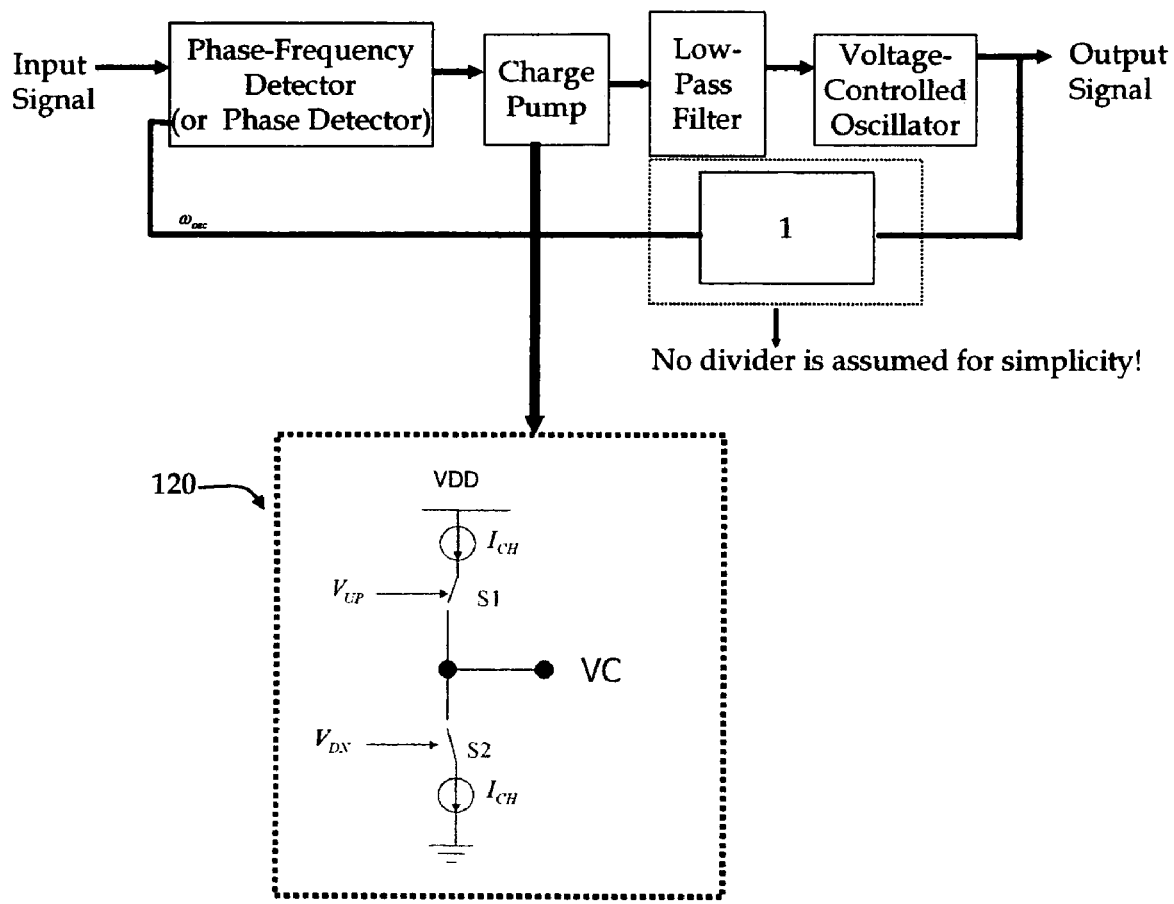
FIG. 1 illustrates a block diagram of a conventional phase-locked loop and a conventional charge-pump circuit.
Figure 2:
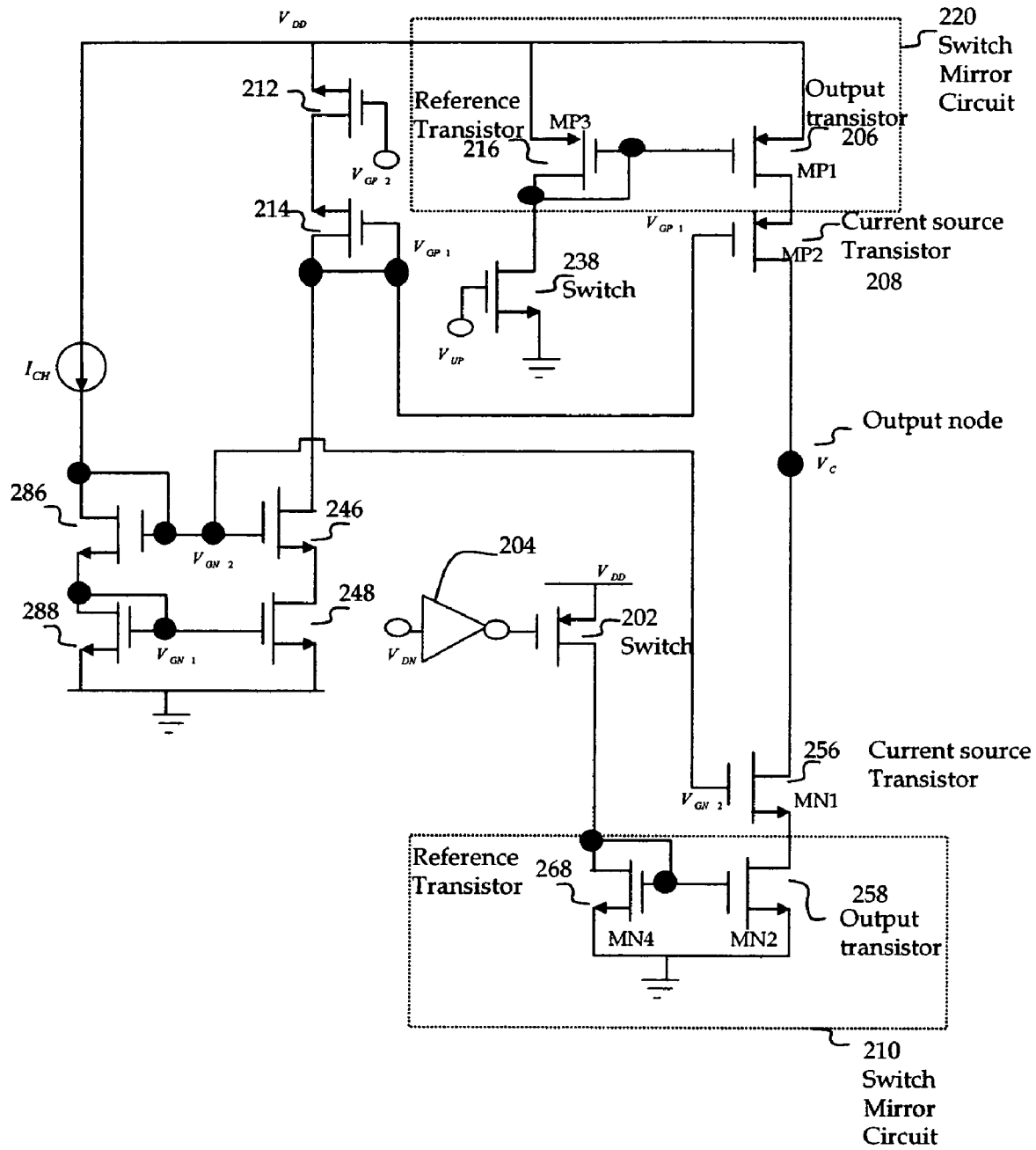
FIG. 2 illustrates a block diagram of a basic high-performance charge-pump circuit for phase-locked loops in accordance with the present invention.

To reduce the charge-sharing problem of a conventional charge-pump circuit 120, FIG. 2 illustrates a block diagram of a basic high-performance charge-pump circuit 200 for phase-locked loops according to the present invention. This basic high-performance charge-pump circuit 200 does not have power-down mode in order to show the fundamental concept of the invention clearly. The basic high-performance charge-pump circuit consists of two current source transistors 208 and 256, PMOS switch mirror transistors 206 and 216, NMOS switch mirror transistors 258 and 268, switches 238 and 202, and an inverter 204. The gate terminal (i.e., $V_{GP2}$) of a PMOS transistor 212 is connected to it drain or ground (e.g., "0", low, etc.).

In current mirror circuits the reference current is conveyed to the output current assuming both reference transistor and output transistor are the same size. In the switch mirror circuits used in FIG. 2, the switch coupled to the diode-connected reference transistor is indirectly mirrored to the output. The great advantage of this basic high-performance charge-pump circuit 200 is to utilize the switch mirrors 220 and 210 as a part of building cascodes at the output.

The PMOS switch 202 is placed between power supply and the drain of a diode-connected NMOS transistor 268 and the NMOS switch 238 is placed between ground and the drain of a diode-connected PMOS transistor 216. The drain node of current source transistors 208 and 256 is directly connected to the output of the basic high-performance charge-pump circuit 200. The drains of output transistors 206 and 258 in the switch mirror circuits are coupled to the sources of the current source transistors 208 and 256, respectively. Thus, clock feed-through is very low because the switches 238 and 202 are separated far from any high impedance output node. At the same time, the drains of the switches are connected to the drains of diode-connected transistors 216 and 268 which have lower impedance nodes.

Up/down signals (i.e., $V_{UP}$ and $V_{DN}$) from the phase-frequency detector (or phase detector) provide the gate voltages of the switches 238 and 202, which mirror the switching action through switch mirror circuits 220 and 210, respectively, in order to control the currents of two current source transistors 208 and 256. Since the output transistors 206 and 258 function as indirect switches, these output transistors 206 and 258 are not completely turned off. Therefore, the resistances looking into from the sources of the PMOS transistor 208 and NMOS transistor 256 are not high. As a result, a long fall time of the current pulses does not occur. Furthermore, when MOS switches turn off, charge-injection errors occur. The charge-injection error due to channel charge is given by $Q_{CH}=WLC_{OX}(V_{GS}-V_T)$. However, the channel charges of the transistors 206 and 258 are very small due to small $(V_{GS}-V_T)$ because the transistors 206 and 258 are not completely turned off. Thus, a very small charge injection and a clock feed-though are not directly conveyed to the output node because the current source transistors 208 and 256 are located between the output node and switch mirror circuits. By stacking PMOS transistors 206 and 208 and NMOS transistors 256 and 258, the output impedance is increased for effective current injection.

Figure 3:
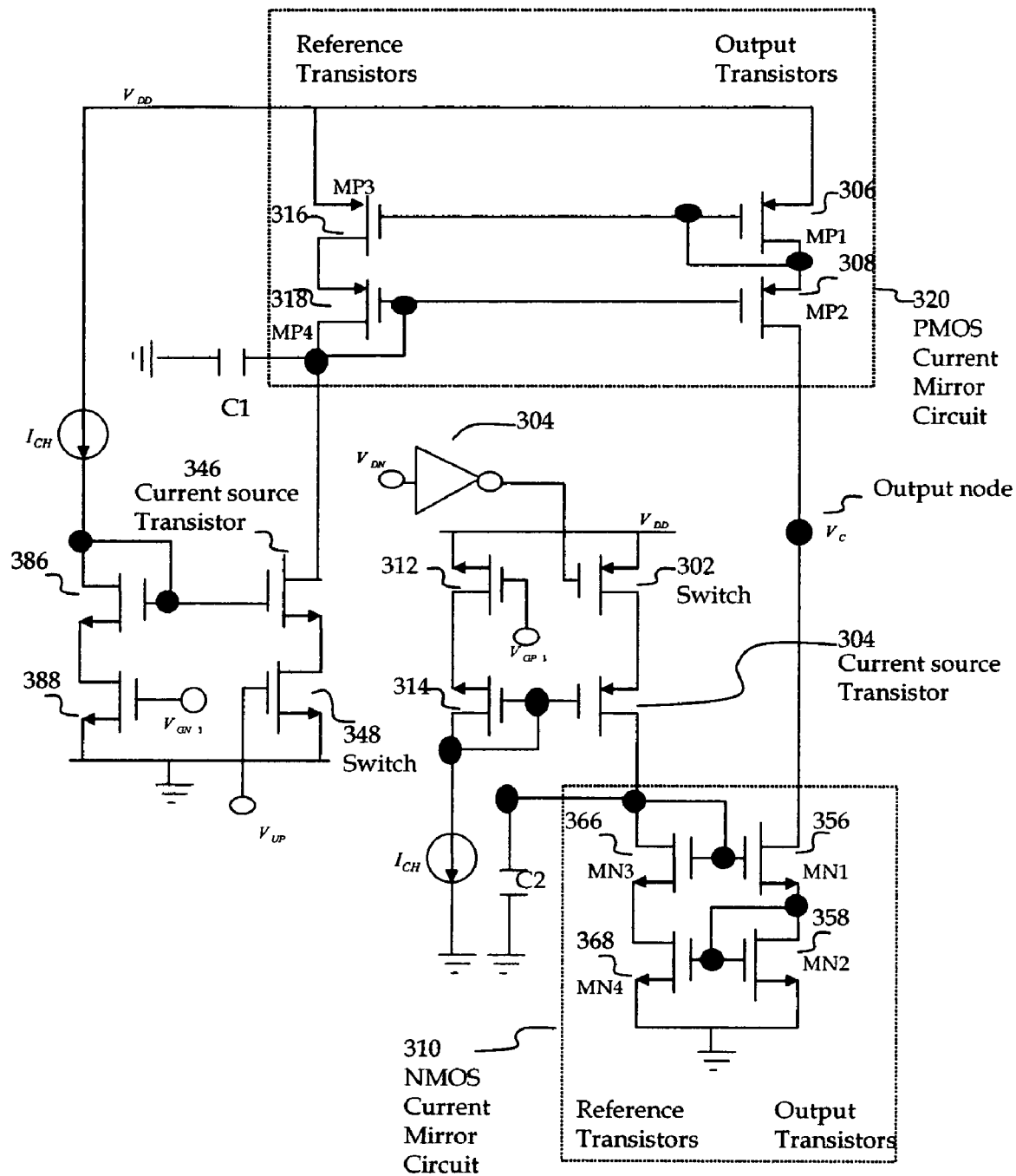
FIG. 3 illustrates a circuit diagram of a modified high-performance charge-pump circuit for phase-locked loops according to the present invention.

FIG. 3 illustrates a block diagram of a modified high-performance charge-pump circuit for phase-locked loops according to the present invention. This modified high-performance charge-pump circuit 300 does not have power-down mode in order to show the fundamental concept of the invention clearly. The modified high-performance charge-pump circuit 300 basically consists of PMOS Wilson current mirror transistors 306, 308, 316 and 318, NMOS Wilson current mirror transistors 356, 358, 366, and 368, current sources transistors 304 and 346, switches 302 and 348, and an inverter 304. The PMOS switch 302 is placed between power supply and the source of a PMOS current source transistor 304 and the NMOS switch 348 is placed between ground and the source of a NMOS current source transistor 346. The gate terminal (i.e., $V_{GN1}$) of a NMOS transistor 388 is connected to it drain or power supply (e.g., "1", high, $V_{DD}$, etc.).

The drain nodes of current source transistors 304 and 346 are directly connected to the drains of reference transistors 366 and 318 in the Wilson current mirrors 310 and 320, respectively. Since the switches 302 and 348 are placed very far from any high impedance output node, clock feed-through is very low. The current glitches which occur at the sources of the current source transistors 304 and 346 when switching transistors 302 and 348 are not directly conveyed to the Wilson current mirror circuits 310 and 320 because the transistors 304 and 346 are still off when the glitches occurs. Assuming the small glitches occur, the small glitches should be greatly reduced through the Wilson current mirror circuits 310 and 320 before they go to the output node.

Up/down signals (i.e., $V_{UP}$ and $V_{DN}$) from the phase-frequency detector (or phase detector) steer the current from the current source 346 and 304 into the Wilson current mirror circuits that mirror the charging and discharging currents into the output node. The resistance looking into from the sources of the PMOS transistor 308 and NMOS transistor 356 are not high because the diode-connected transistors 306 and 358 are coupled to the sources. As a result, a long fall time of the current pulses does not occur. In addition, when MOS switches turn off, charge-injection errors occur. Since the modified high-performance charge-pump circuit of the invention uses the Wilson current mirrors 320 and 310, the output impedance is increased for effective current injection.

Figure 4:
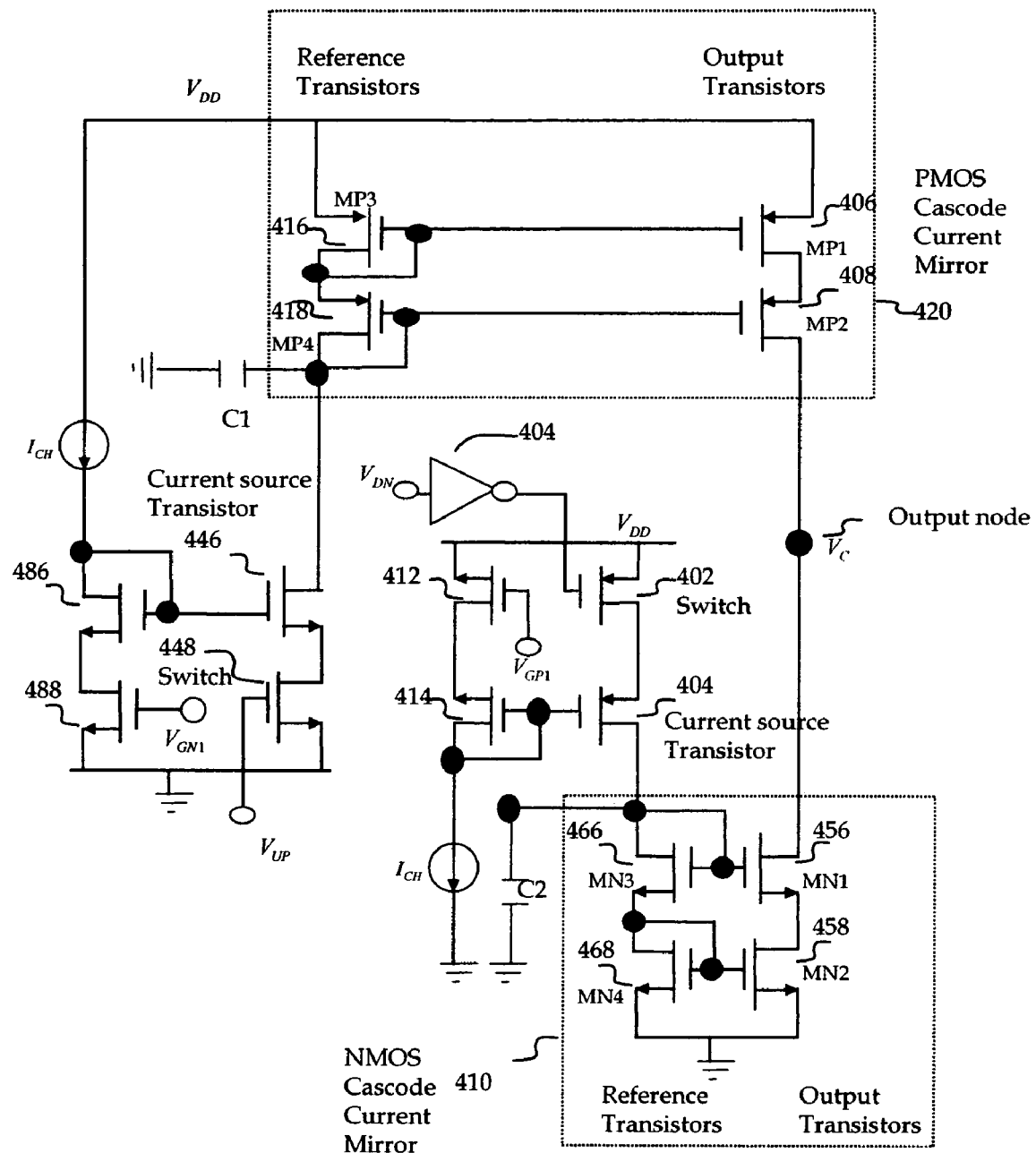
FIG. 4 illustrates a circuit diagram of a modified high-performance high-swing charge-pump circuit for phase-locked loops in accordance with the present invention.

FIG. 4 illustrates a block diagram of a modified high-performance high-swing charge-pump circuit for phase-locked loops according to the present invention. This modified high-performance high-swing charge-pump circuit 400 does not have power-down mode in order to show the fundamental concept of the invention clearly. The circuit 400 basically consists of PMOS cascode current mirror transistors 406, 408, 416 and 418, NMOS cascode current mirror transistors 456, 458, 466, and 468, current source transistors 404 and 446, switches 402 and 448, and an inverter 404.

The operations and principles of the modified high-performance high-swing charge-pump circuits shown in FIG. 4 are the same as those of the circuit shown in FIG. 3. Compared to FIG. 3, the first difference to note is that the Wilson current mirrors 320 and 310 are replaced by the cascode current mirrors 420 and 410, respectively, in order to provide the higher-swing at the output. The resistance looking into from the sources of the PMOS transistor 408 and NMOS transistor 456 are somewhat increased because any diode-connected transistors is not coupled to the sources. However, since the PMOS transistor 408 and NMOS transistor 456 are not switches but parts of cascode current mirror circuits, there is no charge-sharing problem.

In summary, the three high-performance charge-pump circuits of the present invention simply utilize the switch mirror circuit or indirect switching action and thus achieve a drastic improvement in suppressing any charge-injection errors, reducing charge-pump offset (i.e., reducing the power of the spurious sidebands in the synthesized phase-locked loop output signal), increasing the output impedance for effective current injection, and reducing charge-sharing problem. In particular, three high-performance charge-pump circuits 200, 300, and 400 are highly effective for a great reduction of charge injection and clock feed-though to the output node.

In addition, in order to reduce the charge-pump offset, a differential architecture of charge-pump is conventionally adopted. This type of differential charge-pump requires a unity-gain buffer to be placed between two output nodes for the purpose of keeping the two output nodes at the same potential and thus reduces the charge-pump offset. However, differential charge-pump with the unity-gain buffer takes a large chip area. The current source of the unity-gain buffer should be mirrored from a band-gap current, which requires layout complexity. Therefore, the three high-performance charge-pump circuits of the present invention also save chip area because they are very simple.

Each bulk of two stacked PMOS transistors can be connected to its own N-well to obtain better immunity from substrate noise in all high-performance charge-pump circuits. The balance between PMOS output resistance and NMOS output resistance must be considered to obtain high output resistance.

Those skilled in the art will recognize that with minor modifications, these input schemes may be reversed with the down input terminal as the up input terminal and the up input terminal serving as the down input terminal.

All the high-performance charge-pump circuits of the present invention are very efficient to implement in system-on-chip (SOC) or integrated circuit (IC). In addition, these high-performance charge-pump circuits of the present invention are very indispensable for numerous phase-locked loop applications. The present invention provides three different embodiments which achieve a drastic improvement in suppressing any charge-injection errors, reducing charge-pump offset (i.e., reducing the power of the spurious sidebands in the synthesized phase-locked loop output signal), increasing the output impedance for effective current injection, reducing chare-sharing problem, and saving chip area. While the present invention has been described in particular embodiments, it should be appreciated that the present invention should not be construed as being limited by such embodiments, but rather construed according to the claims below.

What is claimed is:

1. A high-performance charge-pump circuit for receiving phase detector outputs and generating an average current flowing into or flow out of the charge-pump circuit output node, comprising:
   a first current mirror circuit consisting of two diode-connected transistors on its input side, and two transistors for a first output current source and a current source transistor coupled to the charge-pump circuit output node for a second output current source, wherein the input side receives a reference current which is relatively independent of temperature, supply, and process variations and the two output sides provide the reference current;
   a second current mirror circuit consisting of a diode-connected transistor and a transistor on its input side, and a current source transistor coupled to the charge-pump circuit output node, wherein the input side of the second current mirror circuit is coupled to receive the reference current from the first output current source of the first current mirror circuit and the output side of the second current mirror circuit provides the reference current;
   a PMOS switch mirror circuit having a diode-connected reference transistor and a output transistor coupled to receive a switching signal and send the switching signal to the current source transistor of the second current mirror circuit;
   a NMOS switch mirror circuit having a diode-connected reference transistor and a output transistor coupled to receive a switching signal and send the switching signal to the second output current source transistor of the first current mirror circuit; and
   two switches for receiving the up and down signals from the phase detector, wherein each switch is coupled between a rail and a reference transistor of a switch mirror circuit.

2. The circuit as recited in claim 1 wherein the switch consists of a PMOS transistor and a NMOS transistor.

3. The circuit as recited in claim 1 wherein the switch is a CMOS transistor.

4. The circuit as recited in claim 1 wherein the gate terminal of the PMOS switch transistor is coupled to an odd number of inverter gates.

5. The circuit as recited in claim 1 wherein the phase detector is phase detector.

6. The circuit as recited in claim 1 wherein the phase detector is phase-frequency detector.

7. The circuit as recited in claim 1 wherein the switch mirror circuit includes a diode-connected reference transistor, whose drain terminal is connected to the drain terminal of a switch.

8. The circuit as recited in claim 7 wherein the switch mirror circuit mirrors the switching action to the drain of the output transistor.

9. The circuit as recited in claim 1 wherein the rail coupled to the NMOS transistor being used as a switch is ground.

10. The circuit as recited in claim 1 wherein the rail coupled to the PMOS transistor being used as a switch is power supply.

11. The circuit as recited in claim 1 wherein the high-performance charge-pump circuit is applied to all phase-locked loops without regard to architectures, topologies, and schematics.

12. A high-performance charge-pump circuit for receiving phase detector outputs and generating an average current flowing into or flow out of the charge-pump circuit output node, comprising:
   two switched current mirror circuits consisting of a diode-connected transistor and a transistor on its input side, and a current source transistor and a switch on its output side, wherein each switched current mirror circuit is coupled to receive a reference current which is relatively independent of temperature, supply, and process variations and send the switched reference current;
   two switches for receiving the up and down signals from the phase detector, wherein each switch is coupled between a rail and a current source transistor of a switched current mirror circuit; and
   two current mirror circuits for receiving the switched reference current and sending the switched reference current to the charge-pump circuit output node, wherein each current mirror circuit is coupled between a switched current mirror circuit and the charge-pump circuit output node.

13. The circuit as recited in claim 12 wherein the switch consists of a PMOS transistor and a NMOS transistor.

14. The circuit as recited in claim 12 wherein the switch is a CMOS transistor.

15. The circuit as recited in claim 12 wherein the gate terminal of the PMOS switch transistor is coupled to an odd number of inverter gates.

16. The circuit as recited in claim 12 wherein the current mirror circuits are cascode current mirror circuits.

17. The circuit as recited in claim 12 wherein the current mirror circuits are Wilson current mirror circuits.

18. The circuit as recited in claim 12 wherein the rail coupled to the NMOS transistor being used as a switch is ground.

19. The circuit as recited in claim 12 wherein the rail coupled to the PMOS transistor being used as a switch is power supply.

20. The circuit as recited in claim 12 wherein the high-performance charge-pump circuit is applied to all phase-locked loops without regard to architectures, topologies, and schematics.

* * * * *